United States Patent
Cheng et al.

(10) Patent No.: US 8,617,937 B2
(45) Date of Patent: Dec. 31, 2013

(54) FORMING NARROW FINS FOR FINFET DEVICES USING ASYMMETRICALLY SPACED MANDRELS

(75) Inventors: Kangguo Cheng, Guilderland, NY (US); Bruce B. Doris, Brewster, NY (US); Ali Khakifirooz, Mountain View, CA (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 487 days.

(21) Appl. No.: 12/886,850

(22) Filed: Sep. 21, 2010

(65) Prior Publication Data

US 2012/0068264 A1  Mar. 22, 2012

(51) Int. Cl.
*H01L 21/335* (2006.01)

(52) U.S. Cl.
USPC .......................................... 438/142; 438/400

(58) Field of Classification Search
USPC ................................................. 438/142, 400
See application file for complete search history.

(56) References Cited

U.S. PATENT DOCUMENTS

| | | | |
|---|---|---|---|
| 7,087,477 B2 | 8/2006 | Fried et al. | |
| 7,183,142 B2 | 2/2007 | Anderson et al. | |
| 7,301,210 B2 | 11/2007 | Abadeer et al. | |
| 7,687,339 B1 | 3/2010 | Schultz et al. | |
| 2007/0181942 A1* | 8/2007 | Knoblinger et al. | 257/336 |
| 2007/0228491 A1* | 10/2007 | Forbes | 257/401 |
| 2007/0254438 A1 | 11/2007 | Bryant et al. | |
| 2007/0292996 A1 | 12/2007 | Abadeer et al. | |
| 2008/0006852 A1* | 1/2008 | Beintner et al. | 257/255 |
| 2008/0124871 A1 | 5/2008 | Seo et al. | |
| 2008/0290397 A1* | 11/2008 | Hsu et al. | 257/324 |
| 2009/0001470 A1 | 1/2009 | Anderson et al. | |
| 2009/0124097 A1 | 5/2009 | Cheng | |

\* cited by examiner

*Primary Examiner* — Jae Lee
(74) *Attorney, Agent, or Firm* — Cantor Colburn LLP; Matthew Zehrer

(57) ABSTRACT

A method of forming fins for fin-shaped field effect transistor (finFET) devices includes forming a plurality of sacrificial mandrels over a semiconductor substrate. The plurality of sacrificial mandrels are spaced apart from one another by a first distance along a first direction, and by a second distance along a second direction. Spacer layers are formed on sidewalls of the sacrificial mandrels such that portions of the spacer layers between sacrificial mandrels along the first direction are merged together. Portions of the spacer layers between sacrificial mandrels along the second direction remain spaced apart. The sacrificial mandrels are removed. A pattern corresponding to the spacer layers is transferred into the semiconductor layers to form a plurality of semiconductor fins. Adjacent pairs of fins are merged with one another at locations corresponding to the merged spacer layers.

11 Claims, 8 Drawing Sheets

US 8,617,937 B2

FORMING NARROW FINS FOR FINFET DEVICES USING ASYMMETRICALLY SPACED MANDRELS

BACKGROUND

The present invention relates generally to semiconductor device processing techniques and, more particularly, to a method of forming narrow fins for fin-shaped field effect transistor (finFET) devices using asymmetrically spaced mandrels.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques.

For example, when the gate length of conventional planar metal oxide semiconductor field effect transistors (MOSFETs) is scaled below 100 nm, problems associated with short channel effects (e.g., excessive leakage between the source and drain regions) become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent one type of structure that has been considered as a candidate for succeeding existing planar MOSFETs. In double-gate MOSFETs, two gates may be used to control short channel effects. A finFET is a recent double-gate structure that exhibits good short channel behavior, and includes a channel formed in a vertical fin. The finFET structure may be fabricated using layout and process techniques similar to those used for conventional planar MOSFETs.

In particular, a conventional spacer image transfer (SIT) process is typically used to form a dense array of fins. In order to fabricate multiple fin devices, either a contact bar process or an epitaxy process is needed to merge the initially formed multiple fins. However, the former approach leads to extra parasitic capacitance, while the latter approach results in process complexity (e.g., spacer removal on fin sidewalls). In addition, epitaxial fin merging also constraints the fin spacing (e.g., equal spacing is needed between the pair of fins formed on a single mandrel and between those formed on neighboring mandrels, and different epitaxial deposition time is needed if fin thickness is changed), and leads to extra parasitic capacitance and resistance due to epitaxial semiconductor growth on top of the fins. Furthermore, a hardmask is also needed to avoid epitaxial growth on top of the gate structure.

SUMMARY

In an exemplary embodiment, a method of forming fins for fin-shaped field effect transistor (finFET) devices includes forming a plurality of sacrificial mandrels over a semiconductor substrate, the plurality of sacrificial mandrels being spaced apart from one another by a first distance along a first direction, and by a second distance along a second direction; forming spacer layers on sidewalls of the sacrificial mandrels such that portions of the spacer layers between sacrificial mandrels along the first direction are merged together and portions of the spacer layers between sacrificial mandrels along the second direction remain spaced apart; removing the sacrificial mandrels; and transferring a pattern corresponding to the spacer layers into the semiconductor layers to form a plurality of semiconductor fins, wherein adjacent pairs of fins are merged with one another at locations corresponding to the merged spacer layers.

In another embodiment, a method of forming fin-shaped field effect transistor (finFET) devices includes forming a plurality of sacrificial mandrels over a semiconductor substrate, the plurality of sacrificial mandrels being spaced apart from one another by a first distance along a first direction, and by a second distance along a second direction; forming spacer layers on sidewalls of the sacrificial mandrels such that portions of the spacer layers between sacrificial mandrels along the first direction are merged together and portions of the spacer layers between sacrificial mandrels along the second direction remain spaced apart; removing the sacrificial mandrels; transferring a pattern corresponding to the spacer layers into the semiconductor layers to form a plurality of semiconductor fins, wherein adjacent pairs of fins are merged with one another at locations corresponding to the merged spacer layers; and forming one or more gate conductors over the plurality of semiconductor fins.

In another embodiment, a fin structure for fin-shaped field effect transistor (finFET) devices includes a plurality of sublithographic semiconductor fins formed over a substrate, disposed along a first direction, with adjacent pairs of semiconductor fins having merged regions, the merged regions corresponding to source/drain regions; a width of the merged regions being a first distance along the first direction; and a first of the merged regions of a first pair of the semiconductor fins being spaced apart from a second of the merged regions of a second pair of the semiconductor fins by a second distance along a second direction; wherein the second distance is about twice the first distance.

BRIEF DESCRIPTION OF THE SEVERAL VIEWS OF THE DRAWINGS

Referring to the exemplary drawings wherein like elements are numbered alike in the several Figures:

FIGS. 1(a) through 1(d) are a sequence of top views illustrating a method of forming fins in finFET devices by a conventional SIT process, in which:

FIG. 1(a) illustrates a pair of long sacrificial mandrels formed over a semiconductor substrate;

FIG. 1(b) illustrates spacers formed on sidewalls of the mandrels of FIG. 1(a);

FIG. 1(c) illustrates the removal of the mandrels, leaving the sidewall spacers;

FIG. 1(d) illustrates transfer of the sidewall pattern into the semiconductor substrate to form fins, and a gate structure formed over the fins;

FIGS. 2(a) through 2(d) are a sequence of top views illustrating a method of forming narrow fins for finFET devices using asymmetrically spaced mandrels in accordance with an embodiment of the invention, in which:

FIG. 2(a) illustrates an array of short sacrificial mandrels formed over a semiconductor substrate;

FIG. 2(b) illustrates spacers formed on sidewalls of the mandrels of FIG. 2(a);

FIG. 2(c) illustrates the removal of the mandrels, leaving the sidewall spacers; and FIG. 2(d) illustrates transfer of the sidewall pattern into the semiconductor substrate to form fins, and a gate structure formed over the fins.

DETAILED DESCRIPTION

Disclosed herein is a method of forming narrow fins for finFET devices using asymmetrically spaced mandrels. As opposed to using long mandrels, as is the practice in conventional SIT process, several small mandrels with different spacing in the x and y directions are utilized, so that in one direction the spacer fully merges the space between the two neighboring mandrels, while in the other direction the spacers are separate. In so doing, each pair of fins formed on a mandrel is automatically merged at the two sides. Consequently, a contact pitch that is twice the fin pitch may be used without the need for specifically merging fins such as by epitaxial semiconductor material growth.

Figure 1A:
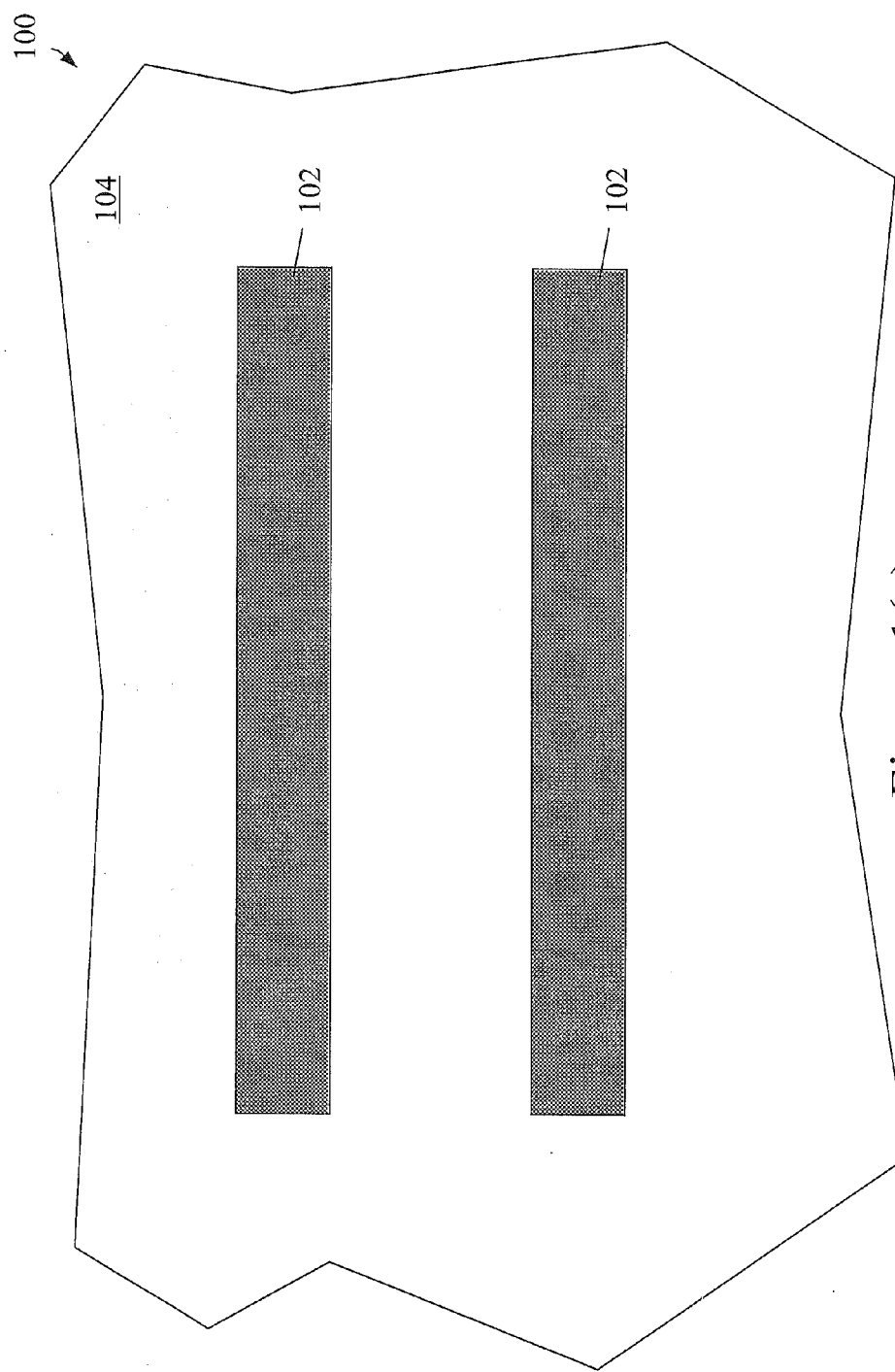

Referring initially to FIGS. 1(a) through 1(d), there is shown a sequence of top views illustrating a method of forming fins in finFET devices by a conventional SIT process. In this process, a semiconductor substrate 100 has long sacrificial mandrels 102 formed thereon as shown in FIG. 1(a). The substrate 100 may be, for example, a semiconductor-on-insulator (SOI) substrate, including a bulk layer (not shown), a buried oxide (BOX) layer (not shown in FIG. 1(a)) formed on the bulk layer, and an SOI (e.g., silicon, germanium, silicon germanium) layer 104 formed on the BOX layer. It should be appreciated, however, that other types of substrates and SOI substrates could also be used. For example, the substrate 100 may be a bulk substrate comprising silicon, germanium, silicon germanium, silicon carbide, or a III-V compound semiconductor (e.g., GaAs), a II-VI compound semiconductors (e.g., ZnSe).

Furthermore, a portion of or the entire semiconductor substrate may be strained. A portion of or entire semiconductor substrate 100 may be amorphous, polycrystalline, or single-crystalline. In addition to the aforementioned types of semiconductor substrates, the semiconductor substrate 100 invention may also comprise a hybrid oriented (HOT) semiconductor substrate in which the HOT substrate has surface regions of different crystallographic orientation. The semiconductor substrate 100 may be doped, undoped or contain doped regions and undoped regions therein. The semiconductor substrate 100 may be strained, unstrained, contain regions of strain and no strain therein, or contain regions of tensile strain and compressive strain.

The long sacrificial mandrels 102 may be formed from a material such as polysilicon, for example. However, other materials (e.g., germanium, silicon germanium) may also be used for the mandrels so long as there is an etch selectivity with respect to subsequently formed sidewall spacers thereon. Although not depicted in FIG. 1(a), an optional pad layer could be formed over the SOI layer 104, prior to the long mandrels 102.

Figure 1B:
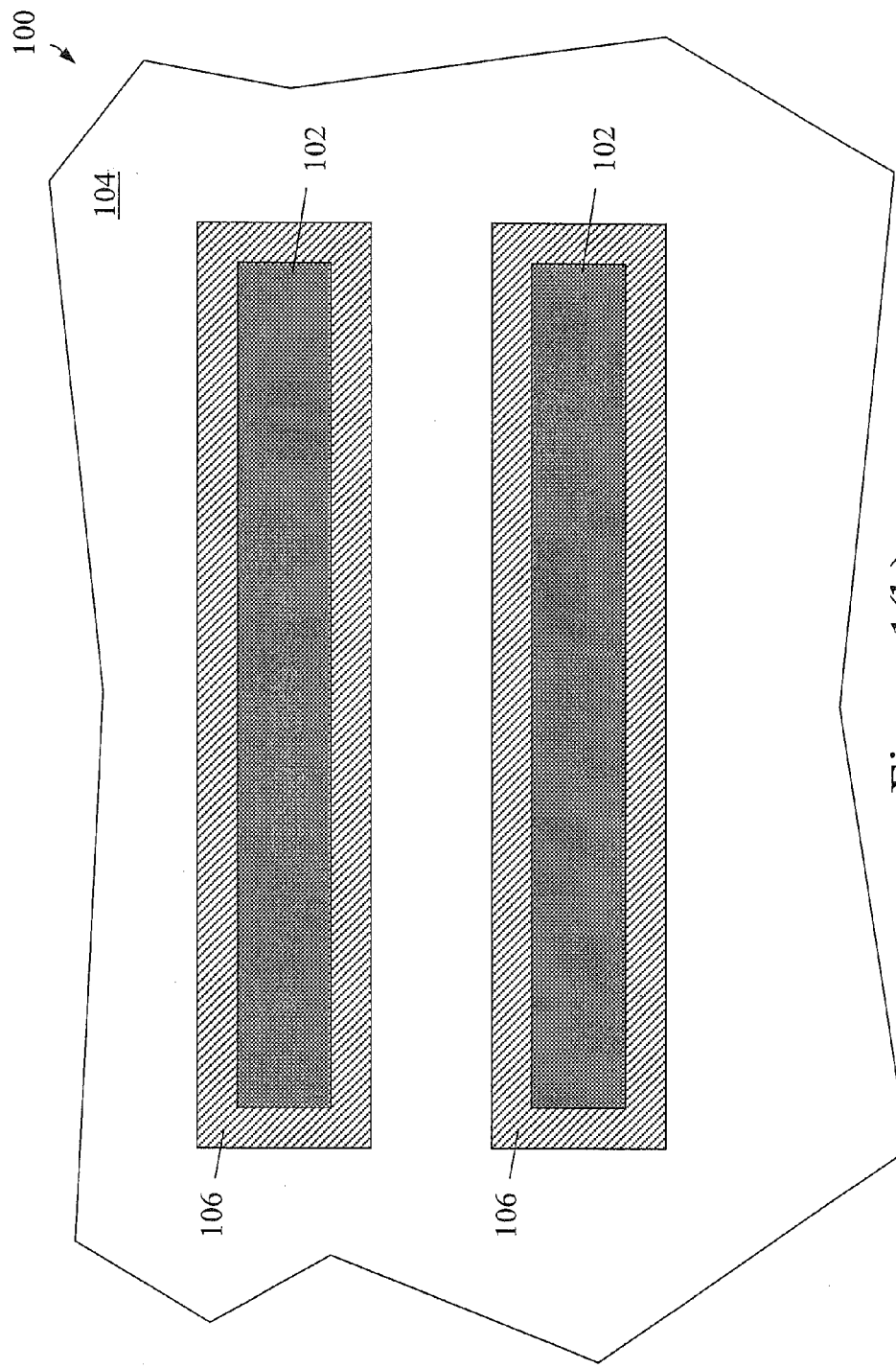
Figure 1C:
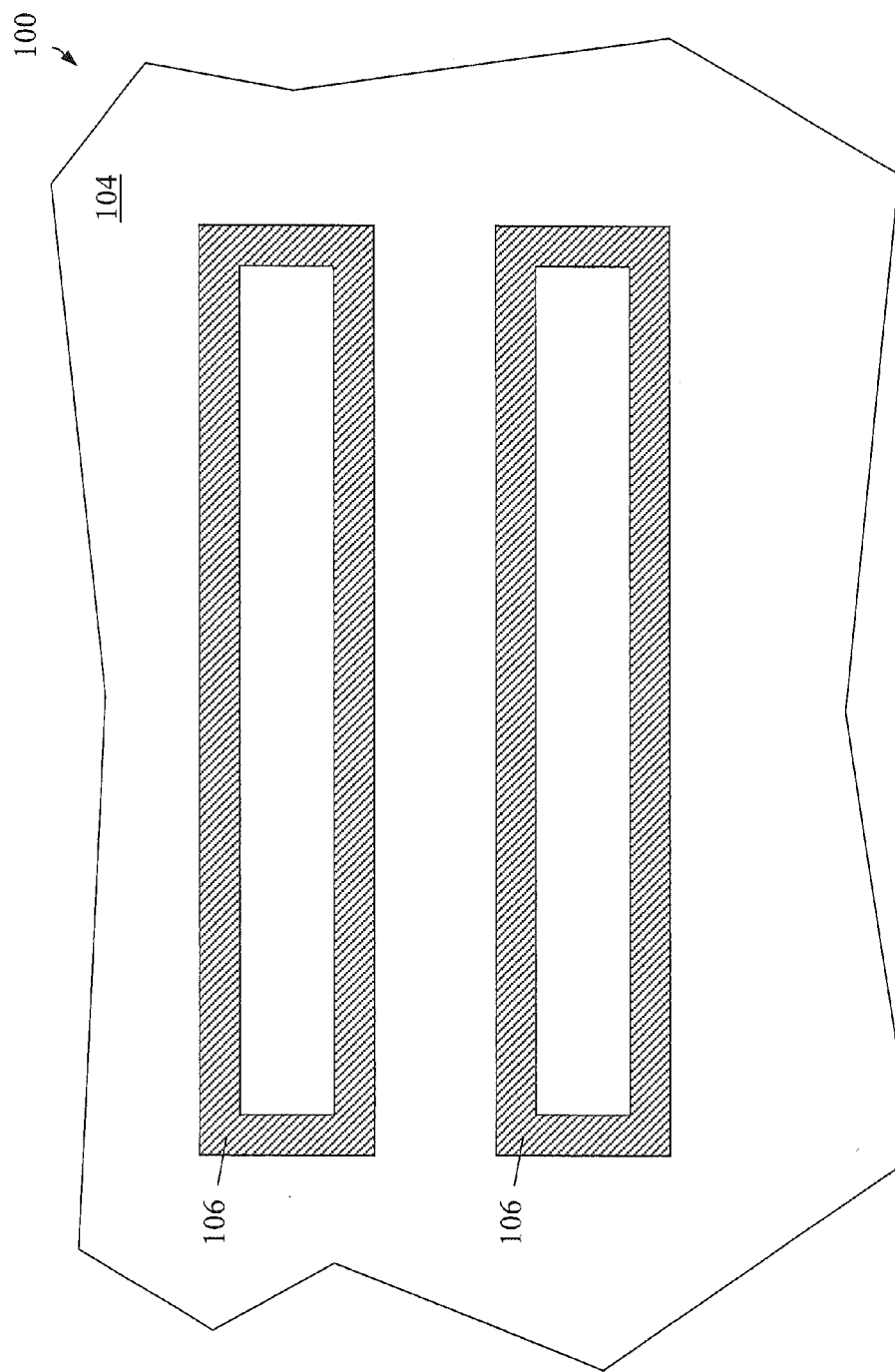
Figure 1D:
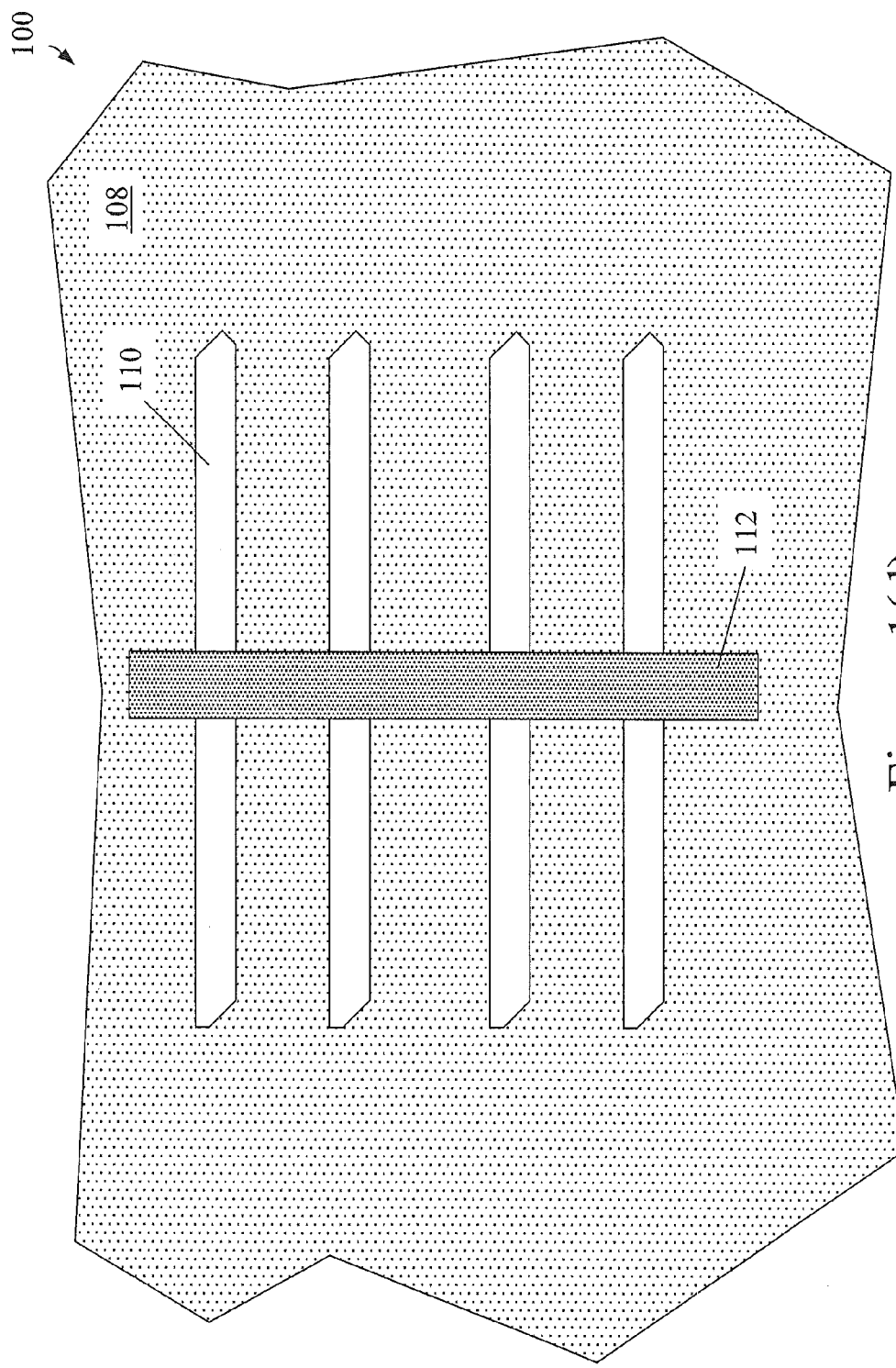

As shown in FIG. 1(b), sidewall spacers 106 are then formed on the long mandrels 102. This is carried out, for example, by depositing a spacer material (e.g., a dielectric such as silicon nitride) followed an anisotropic (directional) etch to remove the spacer material from horizontal or top surfaces of the SOI layer 104 and mandrels 102. In FIG. 1(c), the mandrels 102 are selectively removed such as by etching, leaving the long spacer structures 106 on the SOI layer 104. Then, as shown in FIG. 1(d), the pattern of the spacer structures 106 is transferred into the underlying SOI layer 104, thereby forming semiconductor fins 110. Specifically, the spacer structures 106 act as a hardmask as remaining portions of the SOI layer 104 not having the spacer structures 106 thereon are etched away, down to the buried insulator (BOX) layer 108 beneath the SOI layer 104. Following the semiconductor etching, the spacer structures 106 are removed to reveal the formed semiconductor fins 110. On the other hand, for a trigate structure, the spacer structures are removed.

As will be noted from FIG. 1(d), the ends of the semiconductor fins 110 are shown trimmed away. That is, the outer ends of the upper pair of fins and the lower pair of fins are now removed so as to define disconnected fins. This trimming may be applied to the fins 110 themselves after pattern transfer or, alternatively, applied to the spacer structure 106 of FIG. 1(c) prior to pattern transfer. Another optional trimming may be used to make the fins 110 narrower. Thereafter, conventional device processing continues with gate electrode formation (gate 112), spacer formation, and doping to form the source and drain regions as known in the art. However, as indicated above, for most logic applications a number of fins need to be connected together in order to obtain a desired device width. This in turn requires either a contact bar structure or an epitaxy process to merge the fins wherever needed.

Figure 2A:
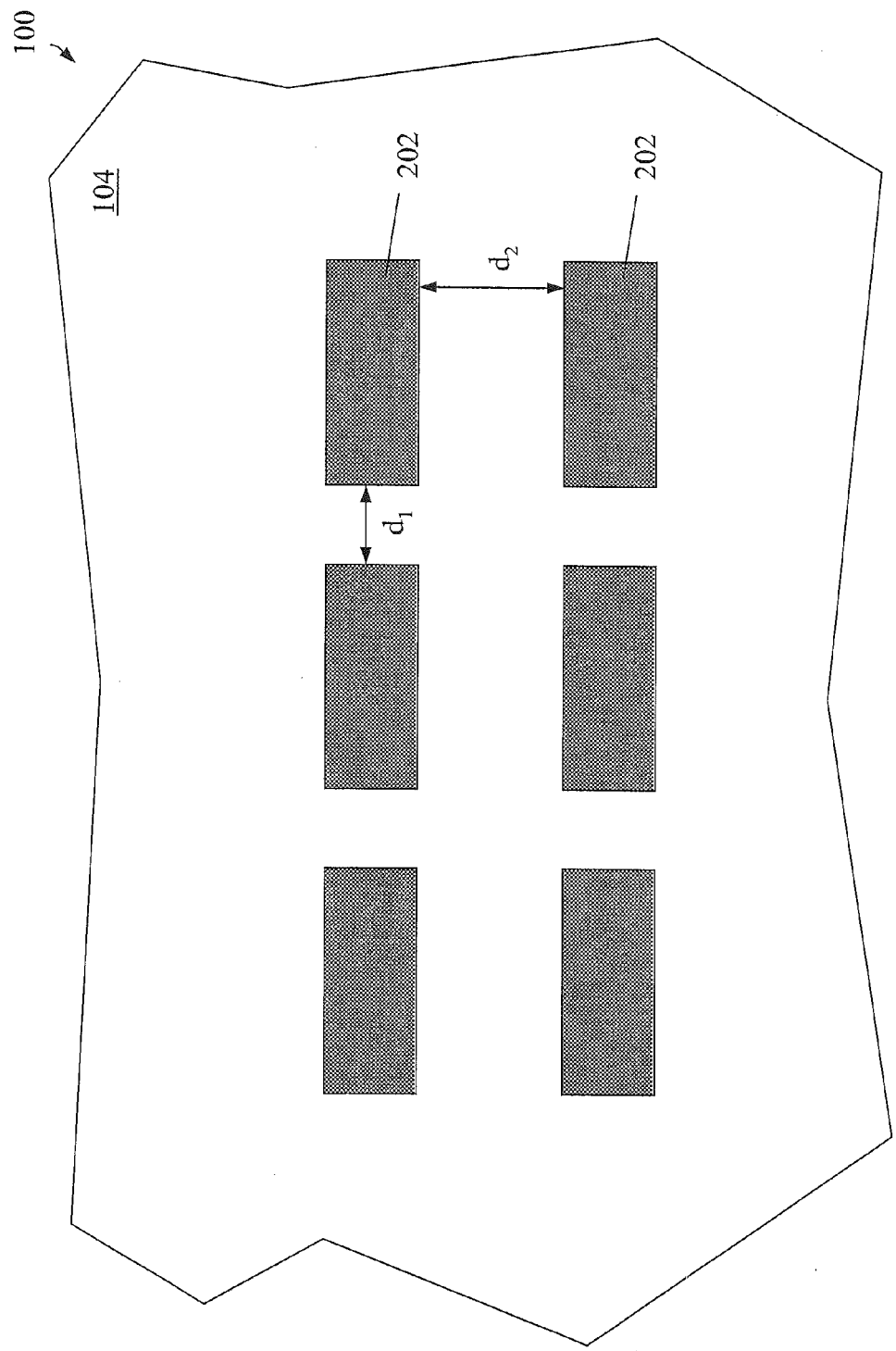

Accordingly, FIGS. 2(a) through 2(d) are a sequence of top views illustrating a method of forming narrow fins for finFET devices using asymmetrically spaced mandrels in accordance with an embodiment of the invention. For simplicity of description, like elements are referred to using like reference numerals in the Figures. As shown in FIG. 2(a), an array of short sacrificial mandrels 202 (with respect to long mandrels 102 in FIG. 1(a)) is formed on the SOI substrate 104. In a first or "x-axis" direction, the spacing, $d_1$, between adjacent mandrels is smaller than the spacing, $d_2$, between adjacent mandrels in a second (orthogonal) or "y-axis" direction, an advantage of which will be illustrated below. In one exemplary embodiment, $d_2$ is about twice the distance of $d_1$. However, other ratios are contemplated such that the subsequently formed sidewall spacer layer merges between adjacent mandrels 202 in the x-axis direction but does not merge between adjacent mandrels 202 in the y-axis direction.

Figure 2B:
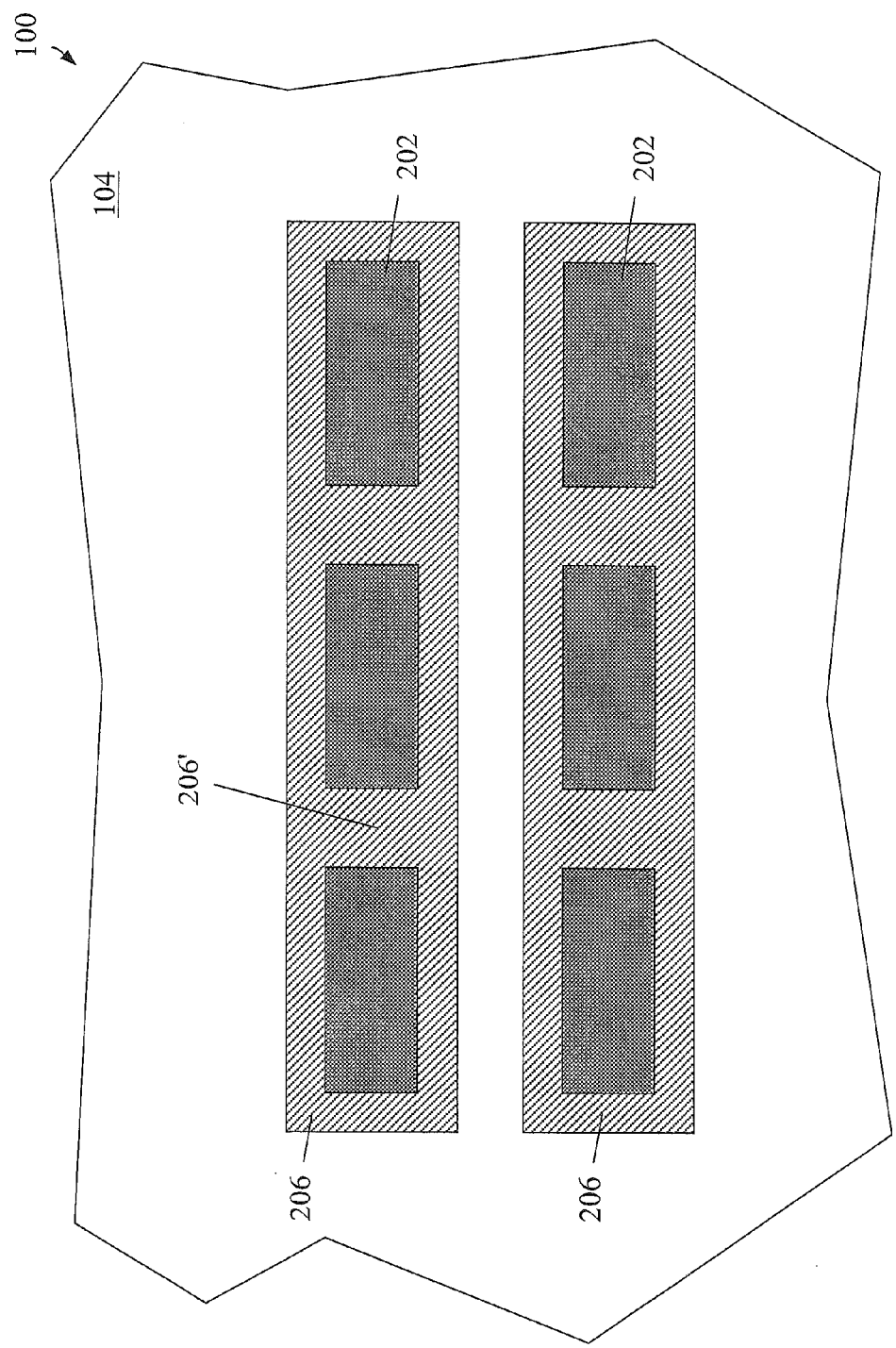

As will also be seen, the mandrel pitch in the x-axis direction corresponds to the gate pitch, while the mandrel pitch in the y-axis direction corresponds to the contact pitch. Here, it will be noted that the fin pitch may have a much higher density as compared to the gate pitch, since gate pitch is typically defined by lithography whereas fins may be defined using SIT. FIG. 2(b) illustrates the formation of the sidewall spacers 206 on the mandrels 202. Again, this may be carried out, for example, by depositing a spacer material (e.g., a dielectric such as silicon nitride) followed an anisotropic etch to remove the spacer material from horizontal or top surfaces of the SOI layer 104 and mandrels 202. As mentioned above, the spacer thickness is tuned so that it merges and fills the spacing between the neighboring mandrels in the x-axis direction, as reflected at 206'. If desired, a trimming step can also be used later to obtain the required fin thickness.

Figure 2C:
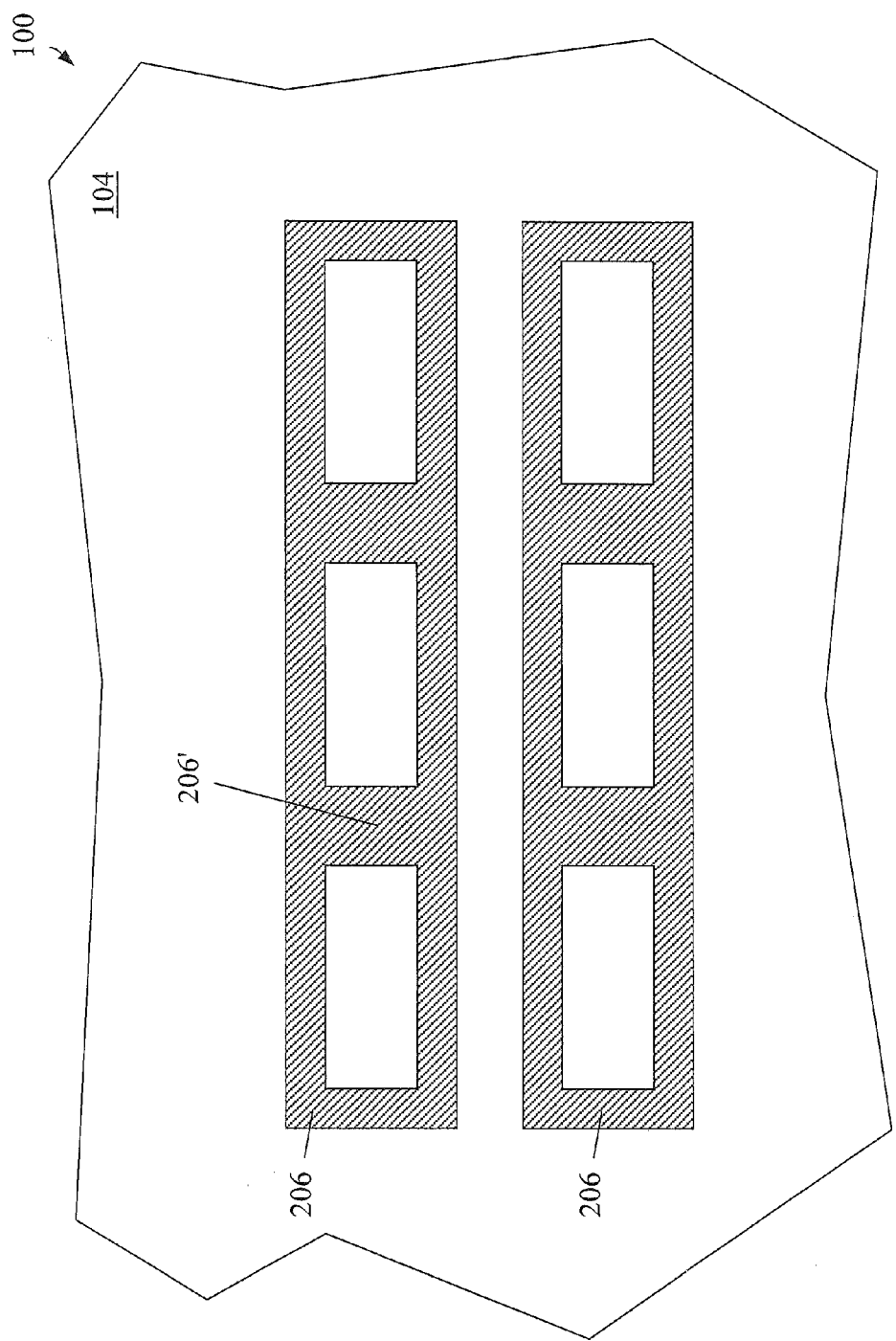
Figure 2D:
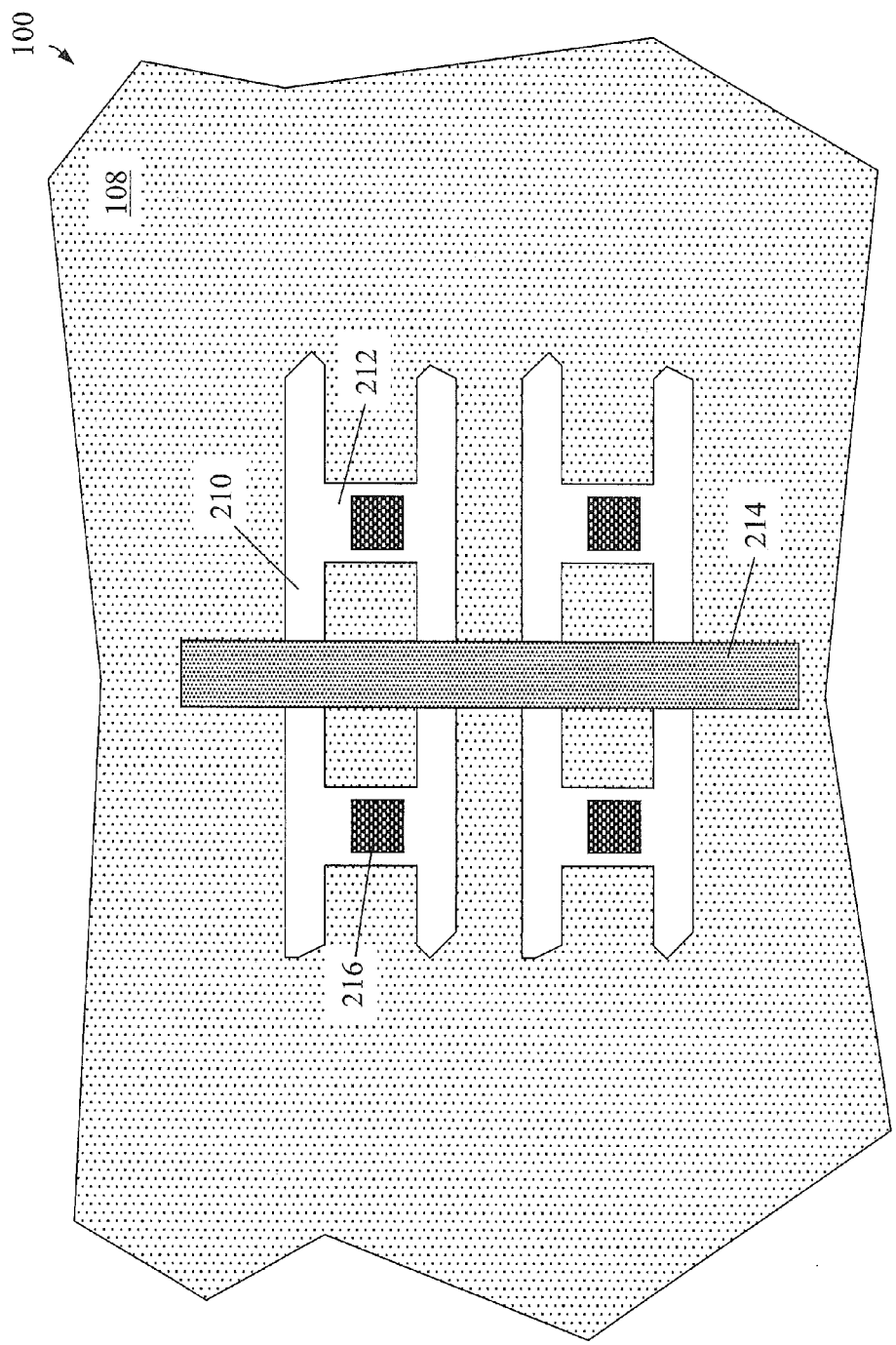

In FIG. 2(c), the mandrels 102 are selectively removed such as by etching, leaving the spacer structures 206 on the SOI layer 104, connected at locations 206'. Then, as shown in FIG. 2(d), the pattern of the spacer structures 206 is transferred into the underlying SOI layer 104, thereby forming semiconductor fins 210. Specifically, the spacer structures 206 act as a hardmask as remaining portions of the SOI layer 104 not having the spacer structures 206 thereon are etched away, down to the buried insulator (BOX) layer 108 beneath the SOI layer 104. Similar to the conventional process of FIG. 1(d), the far ends of the semiconductor fins 210 are shown trimmed away, which may be done after pattern transfer or, alternatively, applied to the spacer structure 206 of FIG. 2(c) prior to pattern transfer.

However, unlike the conventional process of FIG. 1(d), FIG. 2(d) illustrates the merged areas 212 of semiconductor fin material between upper and lower pairs of fins 210 as a result of the merging of the spacer layer 206 previously illustrated in FIG. 1(c). These merged areas 212 are relatively closely spaced with respect to the gate structure 214, and correspond to source and drain regions of the finFET. Thus, such merging of the spacer material leads to automatic patterning of the merged areas 212 in the semiconductor layer, thereby avoiding the need for contact bar formation of epitaxial semiconductor growth processes. Here, source and drain contacts 216 may then be formed on the merged areas of the fin structure formed by the inventive mandrel structures.

Finally, as is the case for the conventional SIT process, portions of the fins 210 may be etched as desired in order to define individual devices. In terms of the structure of the semiconductor fins 210 with respect to the sacrificial mandrels, the merged areas 212 have a width along the x-axis direction corresponding to the distance $d_1$ in FIG. 2(a), and a given merged area 212 in the upper pair of semiconductor fins 210 is spaced from a corresponding merged area 212 in the lower pair of semiconductor fins by the distance $d_2$ in FIG. 2(a). Thus configured, the sublithographic fin structures 210 not only have integral source/drain contact regions, but also have sublithographic contact regions that are self-aligned in a direction perpendicular to fins 210.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming fins for fin-shaped field effect transistor (finFET) devices, the method comprising:
   forming a plurality of sacrificial mandrels over a semiconductor substrate, the plurality of sacrificial mandrels being spaced apart from one another by a first distance along a first direction, and by a second distance along a second direction;
   forming spacer layers on sidewalls of the sacrificial mandrels such that portions of the spacer layers between sacrificial mandrels along the first direction are merged together and portions of the spacer layers between sacrificial mandrels along the second direction remain spaced apart;
   removing the sacrificial mandrels;
   transferring a pattern corresponding to the spacer layers into the semiconductor layers to form a plurality of semiconductor fins, wherein adjacent pairs of fins are merged with one another at locations corresponding to the merged spacer layers;
   forming contact regions on merged portions of the semiconductor fins.

2. The method of claim 1, wherein the second distance is about twice the first distance.

3. The method of claim 1, wherein a first mandrel pitch in the first direction corresponds to a transistor gate pitch.

4. The method of claim 3, wherein a second mandrel pitch in the second direction corresponds to a source/drain contact pitch.

5. The method of claim 1, further comprising trimming away far ends of the semiconductor fins.

6. A method of forming fin-shaped field effect transistor (finFET) devices, the method comprising:
   forming a plurality of sacrificial mandrels over a semiconductor substrate, the plurality of sacrificial mandrels being spaced apart from one another by a first distance along a first direction, and by a second distance along a second direction;
   forming spacer layers on sidewalls of the sacrificial mandrels such that portions of the spacer layers between sacrificial mandrels along the first direction are merged together and portions of the spacer layers between sacrificial mandrels along the second direction remain spaced apart;
   removing the sacrificial mandrels;
   transferring a pattern corresponding to the spacer layers into the semiconductor layers to form a plurality of semiconductor fins, wherein adjacent pairs of fins are merged with one another at locations corresponding to the merged spacer layers;
   forming one or more gate conductors over the plurality of semiconductor fins; and
   forming contact regions on merged portions of the semiconductor fins.

7. The method of claim 6, wherein the second distance is about twice the first distance.

8. The method of claim 6, wherein a first mandrel pitch in the first direction corresponds to a transistor gate pitch.

9. The method of claim 8, wherein a second mandrel pitch in the second direction corresponds to a source/drain contact pitch.

10. The method of claim 6, further comprising trimming away far ends of the semiconductor fins.

11. The method of claim 6, wherein the semiconductor substrate comprises a silicon-on-insulator substrate.

* * * * *